US009490151B2

(12) United States Patent
Asakawa et al.

(10) Patent No.: US 9,490,151 B2
(45) Date of Patent: Nov. 8, 2016

(54) SUBSTRATE PROCESSING APPARATUS AND SUBSTRATE PROCESSING METHOD (71) Applicant: Tokyo Electron Limited, Tokyo (JP)

(72) Inventors: Yuji Asakawa, Yamanashi (JP); Yohei Midorikawa, Yamanashi (JP); Satoshi Toda, Yamanashi (JP); Hiroyuki Takahashi, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/809,035

(22) Filed: Jul. 24, 2015

(65) Prior Publication Data

US 2016/0027672 A1 Jan. 28, 2016

(30) Foreign Application Priority Data

Jul. 24, 2014 (JP) .................................. 2014-151121
Mar. 2, 2015 (JP) .................................. 2015-039883

(51) Int. Cl.
*C23F 1/00* (2006.01)
*H01L 21/67* (2006.01)
*H01L 21/687* (2006.01)
*H01L 21/311* (2006.01)

(52) U.S. Cl.
CPC ... *H01L 21/67126* (2013.01); *H01L 21/31116* (2013.01); *H01L 21/6719* (2013.01); *H01L 21/68742* (2013.01); *H01L 21/68771* (2013.01); *H01L 21/68785* (2013.01); *H01L 21/68792* (2013.01)

(58) Field of Classification Search
CPC .................. H01L 21/67303; H01L 21/67069; H01L 21/67063; H01L 32/67201; H01L 21/67126; H01L 21/31116; H01J 37/32513

USPC .............. 156/345.31, 345.3, 345.32, 345.33; 438/706, 710, 714
See application file for complete search history.

(56) References Cited

U.S. PATENT DOCUMENTS

| 5,769,952 A * | 6/1998 | Komino .............. C23C 16/4404 118/719 |
| 8,513,097 B2 * | 8/2013 | Iwai .................. H01J 37/32623 216/67 |
| 2007/0281085 A1* | 12/2007 | Devine ............... H01L 21/6719 427/248.1 |
| 2008/0217293 A1 | 9/2008 | Iimuro |
| 2010/0211203 A1* | 8/2010 | Oka .................. H01L 21/67103 700/103 |
| 2012/0000612 A1 | 1/2012 | Odagiri et al. |
| 2012/0211351 A1* | 8/2012 | Tomyo .................. B82Y 10/00 204/192.1 |

(Continued)

FOREIGN PATENT DOCUMENTS

JP 2010-520649 A 6/2010
JP 2012-015285 A 1/2012

*Primary Examiner* — Lan Vinh (57) ABSTRACT

A substrate processing apparatus performs a predetermined process on a substrate by using a processing gas under a vacuum atmosphere. The substrate processing apparatus includes a chamber configured to accommodate the substrate and to be kept in the vacuum atmosphere; a substrate mounting table configured to mount the substrate thereon in the chamber; a gas introduction member configured to introduce a gas including the processing gas in the chamber; a partition wall member provided to be movable up and down in the chamber and configured to form a partition wall that defines a processing space in a region including the substrate above the substrate mounting table; and an elevating mechanism configured to move the partition wall member up and down.

20 Claims, 9 Drawing Sheets

(56) References Cited

U.S. PATENT DOCUMENTS

2013/0065396 A1* 3/2013 Dhindsa .......... H01J 37/32009
　　　　　　　　　　　　　　　　　　　　438/694

2013/0276983 A1* 10/2013 Park .................... C23C 16/4584
　　　　　　　　　　　　　　　　　　　　156/345.34

2014/0209240 A1* 7/2014 Matsuzaki ........ H01L 21/67126
　　　　　　　　　　　　　　　　　　　　156/345.31

* cited by examiner

PARTITION WALL MEMBER IS NOT PROVIDED

FIG.9B

PARTITION WALL MEMBER IS PROVIDED

FIG.10

SUBSTRATE PROCESSING APPARATUS AND SUBSTRATE PROCESSING METHOD

CROSS-REFERENCE TO RELATED APPLICATIONS

This application claims priority to Japanese Patent Application Nos. 2014-151121 and 2015-039883 respectively filed on Jul. 24, 2014 and Mar. 2, 2015, the entire contents of which are incorporated herein by reference.

FIELD OF THE INVENTION

The present invention relates to a substrate processing apparatus and a substrate processing method which perform a process on a substrate.

BACKGROUND OF THE INVENTION

In the manufacture of the semiconductor device, a desired device is produced by repeatedly performing various processes such as an etching process, a film forming process and the like onto a semiconductor wafer (hereinafter, simply referred to as "wafer") that is a substrate.

Conventionally, as a substrate processing apparatus, a single wafer processing apparatus in which one wafer is processed at a time has been widely used. This processing apparatus is required to improve throughput, and there has been proposed a processing apparatus that processes two or more substrates at a time while maintaining a flatform of a single wafer processing type (see, e.g., Japanese Patent Application Publication Nos. 2010-520649 and 2012-015285).

In substrate processing apparatuses disclosed in Japanese Patent Application Publication Nos. 2010-520649 and 2012-015285, one substrate mounting table is provided in a chamber, a gas dispersion plate forming a single shower shape is provided above the substrate mounting table to face the substrate mounting table, a plurality of (two) substrates is mounted on the substrate mounting table, the inside of the chamber is maintained in a vacuum state, a processing gas is supplied from the gas dispersion plate, and then a predetermined process is performed on the substrates.

In a substrate process such as an etching process and the like, along with an increased size of a substrate, it is getting difficult to secure uniformity of the process but the demand for the process uniformity is getting increased. However, in the technology disclosed in Japanese Patent Application Publication Nos. 2010-520649 and 2012-015285, it is difficult to acquire desired process uniformity. Specifically, in the technology disclosed in Japanese Patent Application Publication Nos. 2010-520649 and 2012-015285, ununiformity in temperature or gas supply is generated by the interference between substrates, thereby making it difficult to obtain enough process uniformity. Further, even in a general single wafer processing apparatus, enough uniformity in the process may not be obtained.

SUMMARY OF THE INVENTION

In view of the above, the present invention provides a substrate processing apparatus and a substrate processing method which can acquire uniformity in a process when the process is performed on a substrate mounted on a mounting table by using a processing gas.

In accordance with a first aspect of the present invention, there is provided a substrate processing apparatus which performs a predetermined process on a substrate by using a processing gas under a vacuum atmosphere, the substrate processing apparatus including: a chamber configured to accommodate the substrate and to be kept in the vacuum atmosphere; a substrate mounting table configured to mount the substrate thereon in the chamber; a gas introduction member configured to introduce a gas including the processing gas in the chamber; a partition wall member provided to be movable up and down in the chamber and configured to form a partition wall that defines a processing space in a region including the substrate above the substrate mounting table; and an elevating mechanism configured to move the partition wall member up and down.

In accordance with a second aspect of the present invention, there is provided a substrate processing apparatus which performs a predetermined process on a plurality of substrates by using a processing gas under a vacuum atmosphere, the substrate processing apparatus including: a chamber configured to accommodate the substrates and to be kept in the vacuum atmosphere; a plurality of substrate mounting tables configured to respectively mount the substrates thereon in the chamber; at least one gas introduction member configured to introduce a gas including the processing gas in the chamber; a partition wall member provided to be movable up and down in the chamber and configured to form a partition wall that defines processing spaces in respective regions including the substrates above the substrate mounting tables; and an elevating mechanism configured to move the partition wall member up and down.

In accordance with a third aspect of the present invention, there is provided a substrate processing method for performing a predetermined process on a substrate by way of mounting the substrate on a substrate mounting table in a chamber kept in a vacuum state by providing a partition wall member, which is movable up and down, for forming a partition wall that defines a processing space in a region including the substrate above the substrate mounting table and introducing a processing gas from a gas introduction member into the processing space defined by the partition wall member, the substrate processing method including: moving down the partition wall member to allow the substrate to be transferred onto the substrate mounting table; loading the substrate into the chamber and mounting the substrate on the substrate mounting table; moving up the partition wall member to form the processing space in the chamber; introducing the processing gas into the processing space to perform the predetermined process on the substrate; moving down the partition wall member to allow the substrate to be unloaded from the chamber; and unloading the substrate from the chamber in a state where the partition wall member is moved down.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

(Processing System Including COR Processing Apparatus)

Figure 1:
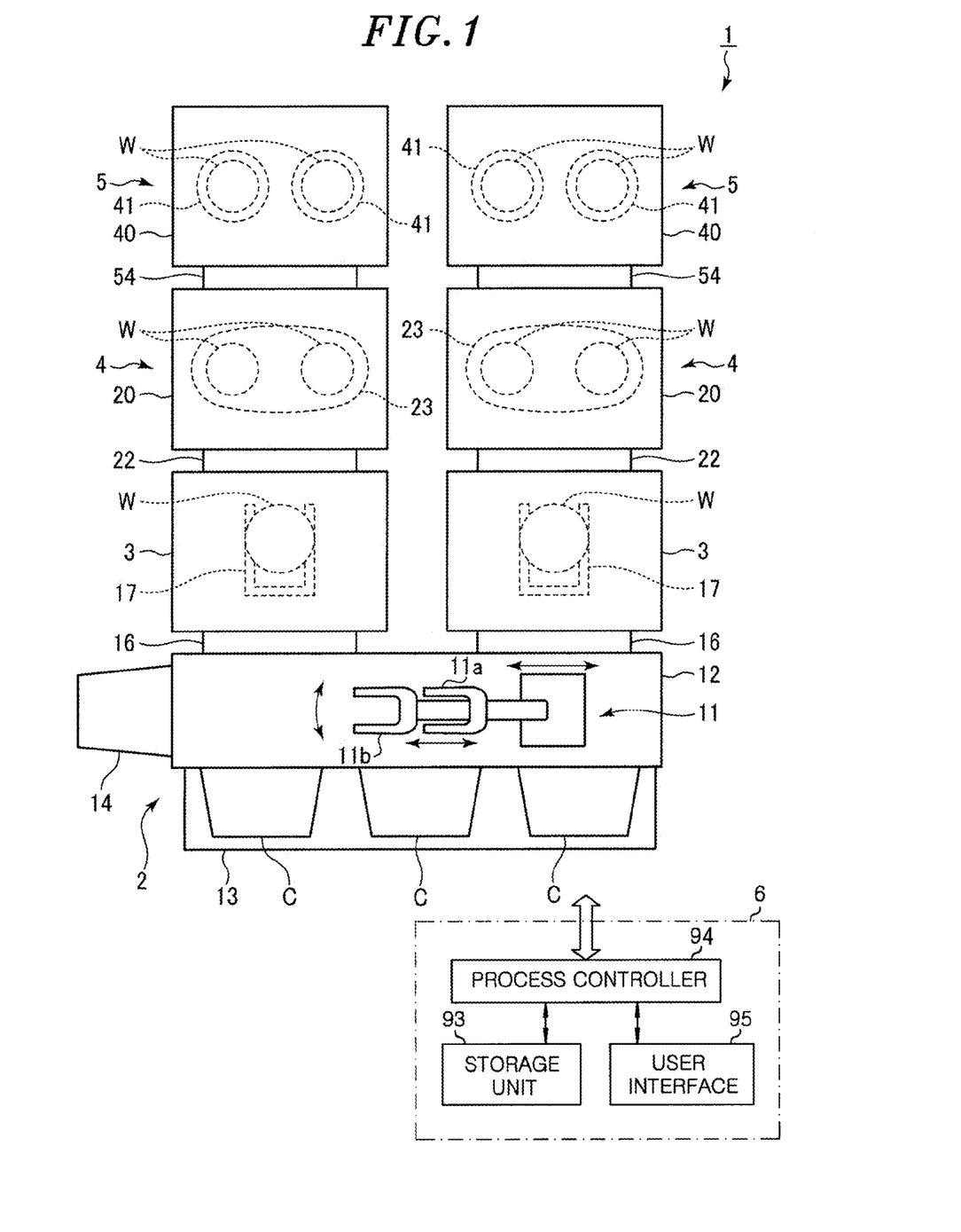
FIG. 1 shows a schematic configuration of a process system including a COR (chemical oxide removal) processing apparatus that is a substrate processing apparatus in accordance with an embodiment of the present invention.

FIG. 1 shows a schematic configuration of a process system including a COR (chemical oxide removal) processing apparatus that is a substrate processing apparatus in accordance with an embodiment of the present invention. A processing system 1 includes: a loading/unloading unit 2 for loading and unloading a semiconductor wafer (hereinafter, simply referred to as "wafer") W that is a substrate to be processed; two load-lock chambers 3 provided adjacent to the loading/unloading unit 2; PHT (post heat treatment) processing apparatuses 4 which are respectively provided adjacent to the load-lock chambers 3 and perform a PHT process on the wafer W; and COR processing apparatuses 5 which are respectively provided adjacent to the PHT processing apparatuses 4 and perform a COR process on the wafer W. The load-lock chambers 3, the PHT processing apparatuses 4 and the COR processing apparatuses 5 are arranged in that order on a straight line. The PHT processing apparatuses 4 and the COR processing apparatuses 5 are configured to process two wafers W at a time.

The loading/unloading unit 2 includes a transfer chamber 12 in which a first wafer transfer mechanism 11 is provided. The first wafer transfer mechanism 11 has two transfer arms 11a and 11b which substantially horizontally hold the wafer W. A mounting stage 13 is provided at a longitudinal side of the transfer chamber 12. To the mounting stage 13, e.g., three carriers C capable of accommodating a plurality of the wafers W are connected. Further, an orienter 14 which performs a position alignment of the wafer W by rotating the wafer W to optically obtain eccentricity of the wafer W is provided adjacent to the transfer chamber 12.

In the loading/unloading unit 2, the wafer W is held by the transfer arm 11a or 11b. The wafer W is transferred to a desired position by being straightly moved on a substantially horizontal plane and moved up and down by the drive of the first wafer transfer mechanism 11. The wafer W is loaded and unloaded by moving the transfer arms 11a and 11b back and forth with respect to the orienter 14, the load-lock chambers 3, and the carriers C on the mounting table 13.

Each of the load-lock chambers 3 is connected to the transfer chamber 12 through a gate valve 16 interposed therebetween. A second wafer transfer mechanism 17 for transferring the wafer W is provided in each of the load-lock chambers 3. Further, the load-lock chambers 3 are configured to be vacuum-exhausted to a predetermined vacuum level.

The second wafer transfer mechanism 17 has an articulated arm and a pick for substantially horizontally holding the wafer W. In the second wafer transfer mechanism 17, the pick is positioned in the load-lock chamber 3 in a state where the articulated arm is retracted, reaches the PHT processing apparatus 4 when the articulated arm is extended, and reaches the COR processing apparatus 5 when the articulated arm is further extended. Therefore, the wafer W can be transferred between the load-lock chamber 3, the PHT processing apparatus 4, and the COR processing apparatus 5.

The PHT processing apparatus 4 includes an evacuable chamber 20 and a substrate mounting table 23, provided in the chamber 20, on which two wafers W are horizontally mounted. A heater is embedded in the substrate mounting table 23. The wafer W subjected to the COR process is heated by the heater to perform the PHT process that evaporates reaction products, which will be later described, generated by the COR process. In the PHT process, an inert gas such as $N_2$ gas and the like is introduced into the chamber 20. A gate valve 22 is provided between the chamber 20 and the load-lock chamber 3, and a gate valve 54 is provided between the chamber 20 and the COR processing apparatus 5.

The COR processing apparatus 5 in accordance with the present embodiment performs the COR process on an oxide film on the surface of the wafer W by using HF gas and $NH_3$ gas in a chamber 40. The detailed configuration will be later described.

The control unit 6 includes a process controller 94 having a microprocessor (computer) which controls the respective components of the processing system 1. Connected to the process controller 94 is a user interface 95 including a keyboard through which an operator performs an input operation of a command to manage the processing system 1, a display on which an operation status of the processing system 1 is visually displayed, and the like. Also connected to the process controller 94 is a storage unit 93 which stores: process recipes that are a control program for implementing the processes such as a supply of a processing gas, an exhaust of the inside of the chamber, and the like in the COR processing apparatus 5 under the control of the process controller 94 and a control program for executing a predetermined process with respect to the respective components of the processing system 1 according to a process condition; various databases and the like. The recipes are stored in a proper storage medium (not shown) in the storage unit 93. Any one of the recipes is called from the storage unit 93 and executed by the process controller 94 as occasion demands. Accordingly, a desired process in the processing system 1 is performed under the control of the process controller 94.

Next, a process operation in the processing system 1 will be described.

First, wafers W having a silicon oxide film thereon are accommodated in the carrier C and transferred to the processing system 1. In the processing system 1, one of the wafers W is transferred from the carrier C of the loading/unloading unit 2 into the load-lock chamber 3 by one of the transfer arms 11a and 11b of the first wafer transfer mechanism 11 in a state where the gate valve 16 at the atmosphere side is opened. The pick of the second wafer transfer mechanism 17 in the load-lock chamber 3 takes over the wafer W.

Thereafter, the gate valve 16 at the atmosphere side is closed and the inside of the load-lock chamber 3 is vacuum-exhausted. Subsequently, the gate valve 22 and the gate valve 54 are opened and the wafer W is transferred to the COR processing apparatus 5 by extending the pick to the COR processing apparatus 5.

Next, the pick returns to the load-lock chamber 3, and the gate valve 22 and the gate valve 54 are closed. In the COR processing apparatus 5, the COR process is performed, which will be described later in detail.

After completing the COR process, the gate valves 22 and 54 are opened and the pick of the second wafer transfer mechanism 17 receives the wafer W having been subjected to the COR process. The wafer W is mounted on the substrate mounting table 23 in the chamber 20 of the PHT processing apparatus 4. The pick is retracted to the load-lock chamber 3 and the gate valves 22 and 54 are closed. In the chamber 20 of the PHT processing apparatus 4, the wafer W is heated to perform the PHT process. By doing so, reaction products generated by the above COR process are heated, evaporated and removed.

After completing the heating process in the PHT processing apparatus 4, the gate valve 22 is opened and the wafer W having been subjected to the etching process on the substrate mounting table 23 is transferred to the load-lock chamber 3 by the pick of the second wafer transfer mechanism 17. The wafer W is returned to the carrier C by one of the transfer arms 11a and 11b of the first wafer transfer mechanism 11. In this manner, a process on a single wafer is completed. Such a series of processes is repeated as many as the number of the wafers W accommodated in the carrier C.

(Configuration of the COR Processing Apparatus)

Next, the COR processing apparatus in accordance with the present embodiment will be described.

Figure 2:
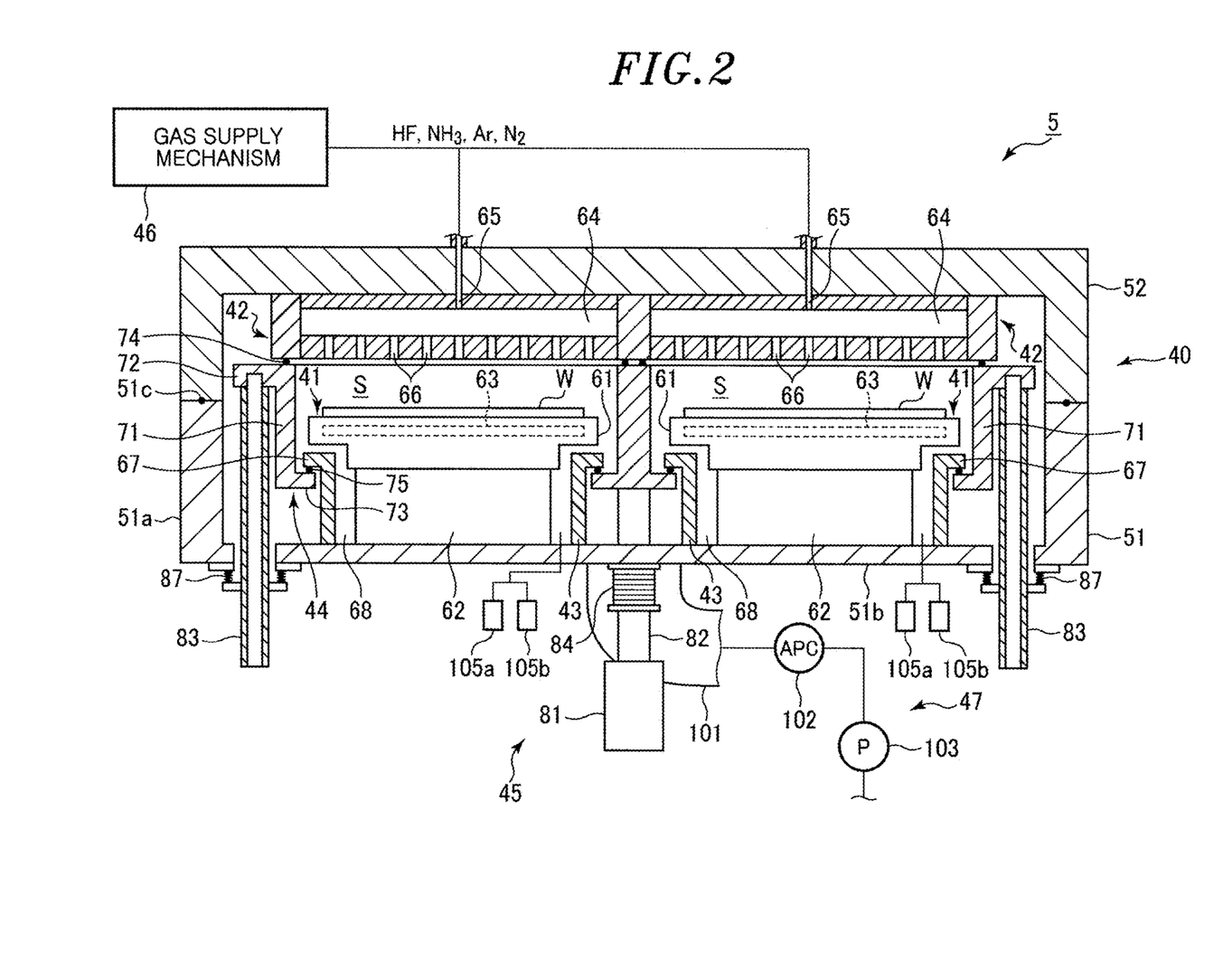
FIG. 2 is a cross-sectional view showing the COR processing apparatus in accordance with the embodiment of the present invention, wherein a partition wall member is elevated.
Figure 3:
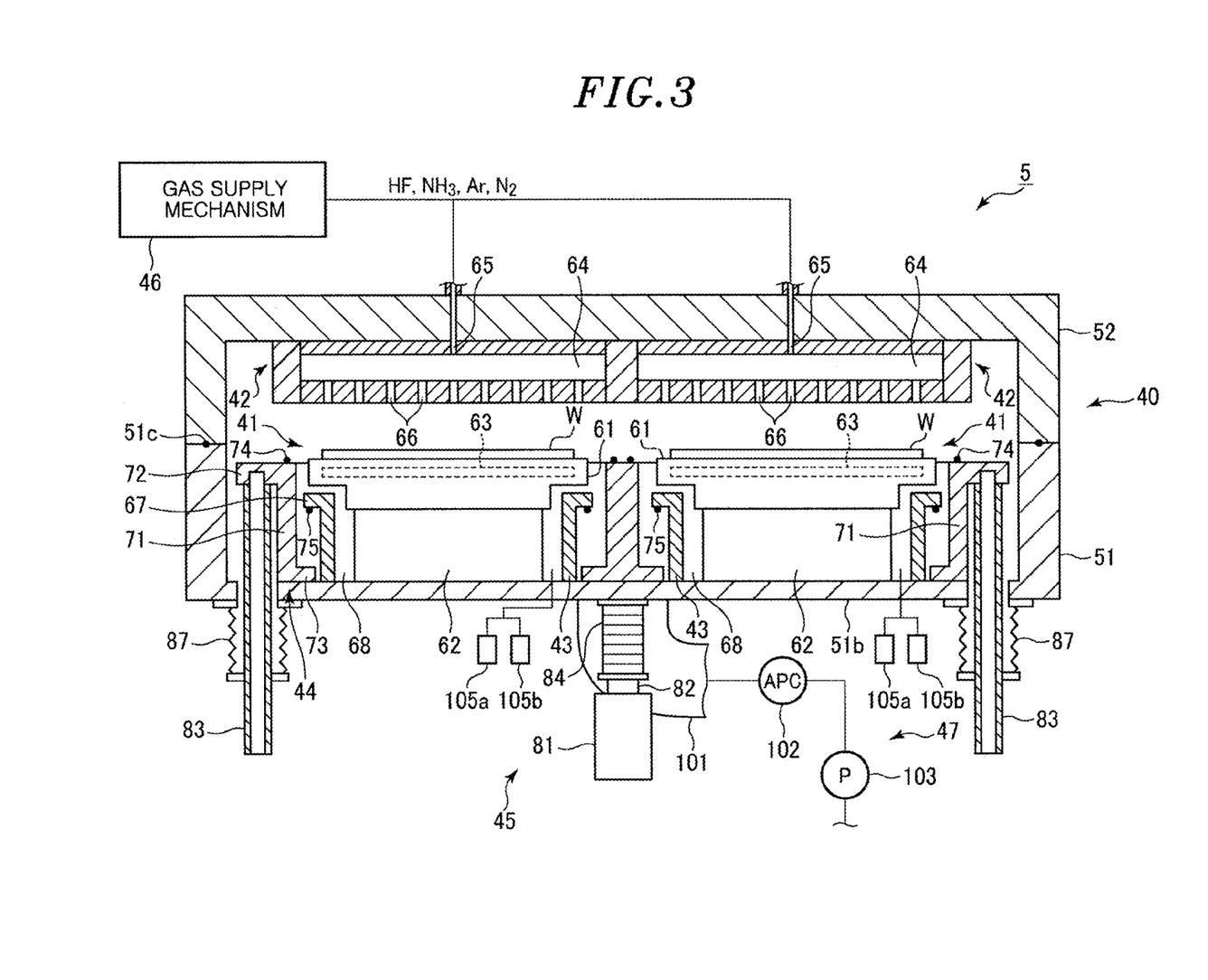
FIG. 3 is a cross-sectional view showing the COR processing apparatus in accordance with the embodiment of the present invention, wherein the partition wall member is lowered.

FIGS. 2 and 3 are cross-sectional views showing the COR processing apparatus in accordance with the present embodiment, wherein FIG. 2 illustrates a state where a partition wall members are elevated and FIG. 3 illustrates a state where the partition wall members are lowered.

As shown in FIGS. 2 and 3, the COR processing apparatus includes: an airtight chamber 40; two substrate mounting tables 41, provided in the chamber 40, on each of which a single wafer W is horizontally mounted; two gas introduction members 42, respectively arranged above the substrate mounting tables 41 so as to face the substrate mounting tables 41, for introducing a processing gas into the chamber 40; two inner walls 43 respectively provided around the lower portion of the substrate mounting tables 41; a partition wall member 44, which is movable up and down, for forming a partition wall that defines an enclosed processing space S in a region including the wafer W between each of the substrate mounting tables 41 and the corresponding gas introduction member 42; an elevating mechanism 45 for moving up and down the partition wall member 44; a gas supply mechanism 46 for supplying HF gas, NH$_3$ gas and the like; and an exhaust mechanism 47 for exhausting the inside of the chamber 40.

The chamber 40 is made of, e.g., aluminum or aluminum alloy and has a chamber main body 51 and a cover 52. The chamber main body 51 includes a sidewall portion 51a and a bottom portion 51b. The top portion of the chamber main body 51 is open and the opening is covered with the cover 52. The sidewall portion 51a and the cover 52 are sealed by a sealing member 51c, so that airtightness of the inside of the chamber 40 is ensured. At the inner side of the cover 52, the aforementioned two gas introduction members 42 are installed. A loading/unloading port (not shown) through which the wafer W is loaded and unloaded to and from the chamber 20 of the PHT processing apparatus 4 is provided at the sidewall portion 51a of the chamber main body 51. The loading/unloading port is opened and closed by the aforementioned gate valve 54.

The substrate mounting table 41 has a substantially columnar shape and includes: a mounting plate 61 having a wafer-mounting surface; and a base block 62 which is fixed to the bottom portion 51b of the chamber main body 51 and supports the mounting plate 61. A temperature controller 63 for controlling the temperature of the wafer W is installed in the mounting plate 61. The temperature controller 63 has a passageway through which, e.g., a temperature control medium (e.g., water or the like) is circulated. The temperature of the wafer W is controlled by heat exchange with the temperature control medium flowing through the passageway. A plurality of lifting pins (not shown) used in the transfer of the wafer W is provided at the substrate mounting table 41 so that they can protrude and retreat with respect to the wafer-mounting surface.

The inner wall 43 has a cylindrical shape and is arranged around the base block 62 with a space between them. The space is an annular exhaust space 68. A flange 67 is formed at a top portion of the inner wall 43. Slits (not shown) are formed in the inner wall 43. An exhaust gas having reached the annular exhaust space 68 from the processing space S is uniformly discharged to the outside space of the inner wall 43 through the slits of the inner wall 43, and exhausted by the exhaust mechanism 47 which will be later described.

The gas supply mechanism 46 supplies HF gas, NH$_3$ gas, and a dilution gas of Ar gas, N$_2$ gas or the like to the gas introduction member 42. The gas supply mechanism 46 includes a gas supply source, a supply line, a valve and a flow rate controller such as a mass flow controller, with respect to each gas.

The gas introduction member 42 introduces a gas supplied from the gas supply mechanism 46 into the chamber 40. The gas introduction member 42 has therein a gas diffusion space 64. The entire shape of the gas introduction member 42 is a cylindrical shape. A gas inlet hole 65 extended through the top wall of the chamber 40 is formed at the top portion of the gas introduction member 42. At the bottom portion of the gas introduction member 42, a plurality of gas injection holes 66 are provided to communicate with the gas diffusion space 64. A gas such as HF gas, NH$_3$ gas and the like supplied from the gas supply mechanism 46 reaches the gas diffusion space 64 through the gas inlet hole 65, diffuses in the gas diffusion space 64, and is uniformly injected in a shower form through the gas injection holes 66. That is, the gas introduction member 42 serves as a gas dispersion head (shower head) that dispersely discharges a gas. Further, the gas introduction member 42 may be a post-mix type that discharges HF gas and NH$_3$ gas through separate flow paths.

Figure 4:
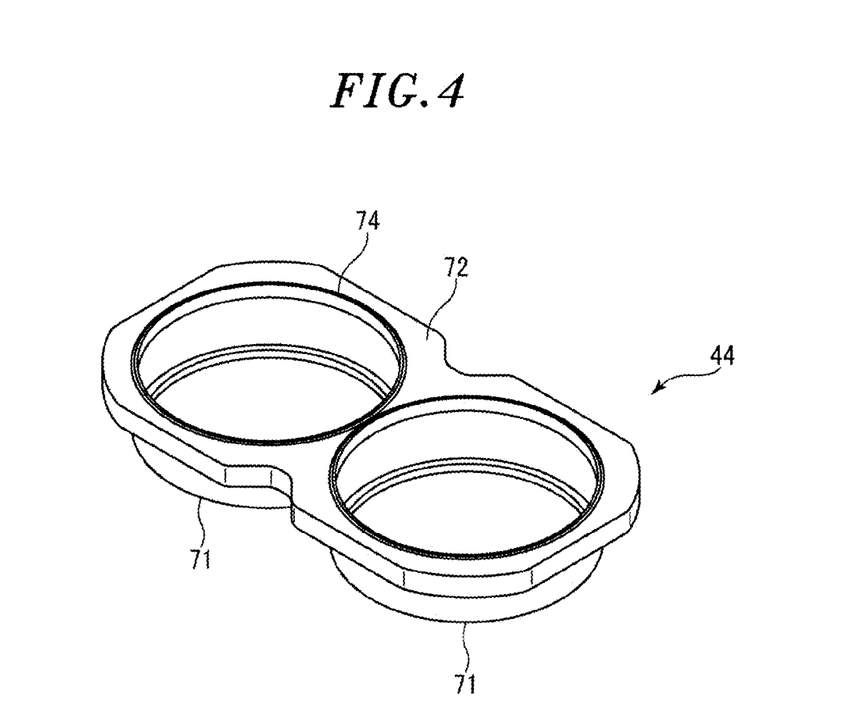
FIG. 4 is a perspective view showing the partition wall member.

The partition wall member 44 integrally forms the partition wall that defines two processing spaces corresponding to the two substrate mounting tables 41. As shown in a perspective view of FIG. 4, the partition wall member 44 includes two cylindrical parts (tube-shaped parts) for forming the respective processing spaces, and a flange part 72 provided in a flange shape at the top portion of the cylindrical parts 71. An inner flange part 73 is formed at the bottom portion of the cylindrical parts 71 (see FIG. 2)

Two sealing members 74 are provided at the top surface of the flange part 72 corresponding to the respective processing spaces S. As shown in FIG. 3, a sealing member 75 is provided at each of the bottom surfaces of the flanges 67 of the inner walls 43. As shown in FIG. 2, the sealing member 74 comes into contact with the bottom surface of the gas introduction member 42 in an elevated status of the partition wall member 44 to make the partition wall member and the gas introduction member 42 airtightly stick to each other, and the sealing member 75 comes into contact with the top surface of the inner flange part 73 of the partition wall member 44 to make the partition wall member and the inner wall 43 airtightly stick to each other. Accordingly, substantially airtight processing space S is formed.

As the sealing members 74 and 75, a lip seal having a main part and a lip part protruding obliquely from the main part may be suitably used. The lip part of the lip seal constitutes a sealing portion. By using the lip seal as the sealing members 74 and 75, a gap between the partition wall member 44 and the gas introduction member 42, and a gap between the partition wall member 44 and the inner wall 43 can be sealed while keeping a clearance without directly making them contact with each other. Therefore, generation of particles, which may be generated due to the contact of the partition wall member 44 and the gas introduction member 42 and the contact of the partition wall member 44 and the inner wall 43, can be prevented. The clearance is adjusted in the lip part of the lip seal and thus the clearance can be easily adjusted. In order to obtain a desired sealing performance between the partition wall member 44 and the gas introduction member 42 and between the partition wall member and the inner wall 43 while preventing direct contact therebetween, it is preferable that the sealing is performed so as to make the clearance therebetween be in a range from 1.6 to 3.6 mm.

As will be described later, a differential pressure between the inside of the chamber 40 which is a vacuum state and the outside of the chamber 40 which is an atmospheric space is used in the elevation of the partition wall member 44, and the driving power is small. For this reason, as for the sealing members 74 and 75, it is required to use one capable of uniform sealing in a state of an utmost small reaction force. In this regard, since the lip seal has a constant reaction force close to 0 in a sealed state, the sealing can be sufficiently performed by using the lip seal even though the driving power is small.

However, the lip seal is suitable for environment having a small differential pressure such as environment between vacuum and vacuum, between atmosphere and atmosphere, or the like. Thus, in a case of using the lip seal as the sealing members 74 and 75, a differential pressure between the inner side and the outer side of the partition wall member 44 needs to be small. The differential pressure is preferable to be 300 Torr or less.

The lip part of the lip seal needs to head a direction of a higher pressure. Therefore, in a case of using the lip seal as the sealing member 74, a lip seal of which a lip part faces toward the processing space S of a higher pressure, i.e., toward the inner side is used. Moreover, in a case of using the lip seal as the sealing member 75, a lip seal of which a lip part faces toward the processing space S of a higher pressure, i.e., toward the outer side is used.

Although the sealing member 75 is provided at the bottom surface of the flange 67 of the inner wall 43, the sealing member 75 may be provided at the upper surface of the inner flange part 73 of the partition wall member 44.

Figure 5:
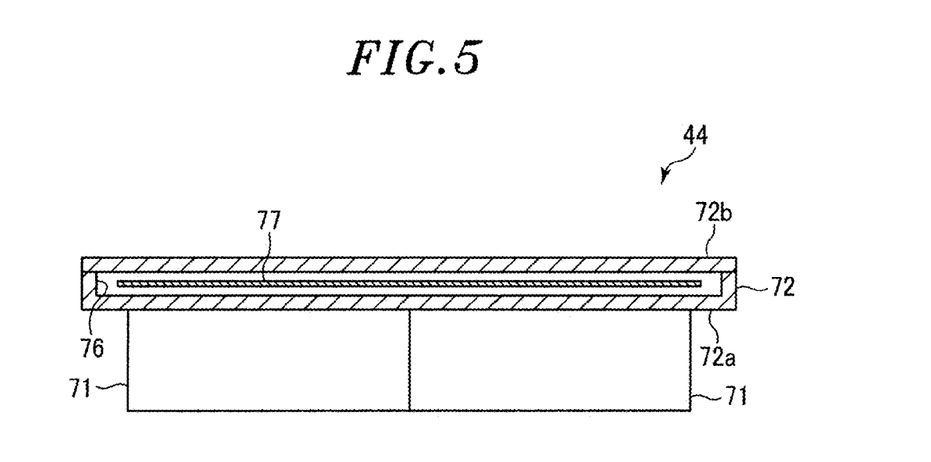
FIG. 5 is a side view of the partition wall member, wherein a cross-section of a flange part is shown.

As shown in FIG. 5, the flange part 72 of the partition wall member 44 includes a main part 72a having a groove portion 76 extending along the periphery thereof. Inside the groove portion 76, a heater 77 is provided to extend along the groove portion 76. A cover part 72b is welded on the top portion of the main part 72a. The groove portion 76 is an airtight space. The heater 77 is connected to a heater power supply (not shown) arranged at the outside of the chamber 40. When the heater power supply supplies power to the heater 77, the heater 77 generates heat. The heat rapidly diffuses from the upper portion of the partition wall member 44 to the lower portion thereof. Then, the inside of the processing space S is heated to, e.g., 30° C. to 150° C., and maintained in a uniformly heated state. As will be described later, the groove portion 76 communicates with the atmosphere through a guide shaft of the elevating mechanism 45, and thus the groove portion 76 is an atmospheric space. For this reason, an excessive temperature increase hardly occurs and controllability of the heater 77 becomes satisfactory.

The elevating mechanism 45 for moving up and down the partition wall member 44 is disposed at the outside of the chamber 40. The elevating mechanism 45 includes: an actuator 81 capable of moving up and down the partition wall member 44; a driving shaft 82 which is extended from the actuator 81 and inserted into the chamber 40, the leading end of the driving shaft 82 attached to the flange part 72 of the partition wall member 44; and a plurality of hollow guide shafts 83 of which the leading ends are attached to the partition wall member 44 and the other end is extended to the outside of the chamber 40. If two guide shafts 83 are provided, a stable support is possible by three shafts including the driving shaft 82, and the partition wall member 44 can be stably moved up and down. If four guide shafts 83 are provided, the partition wall member 44 can be elevated more uniformly. However, increasing the number of the guide shafts 83 causes a deterioration in aspects of cost and maintenance. Accordingly, the number of the guide shafts 83 may be determined in consideration of the above.

Figure 6:
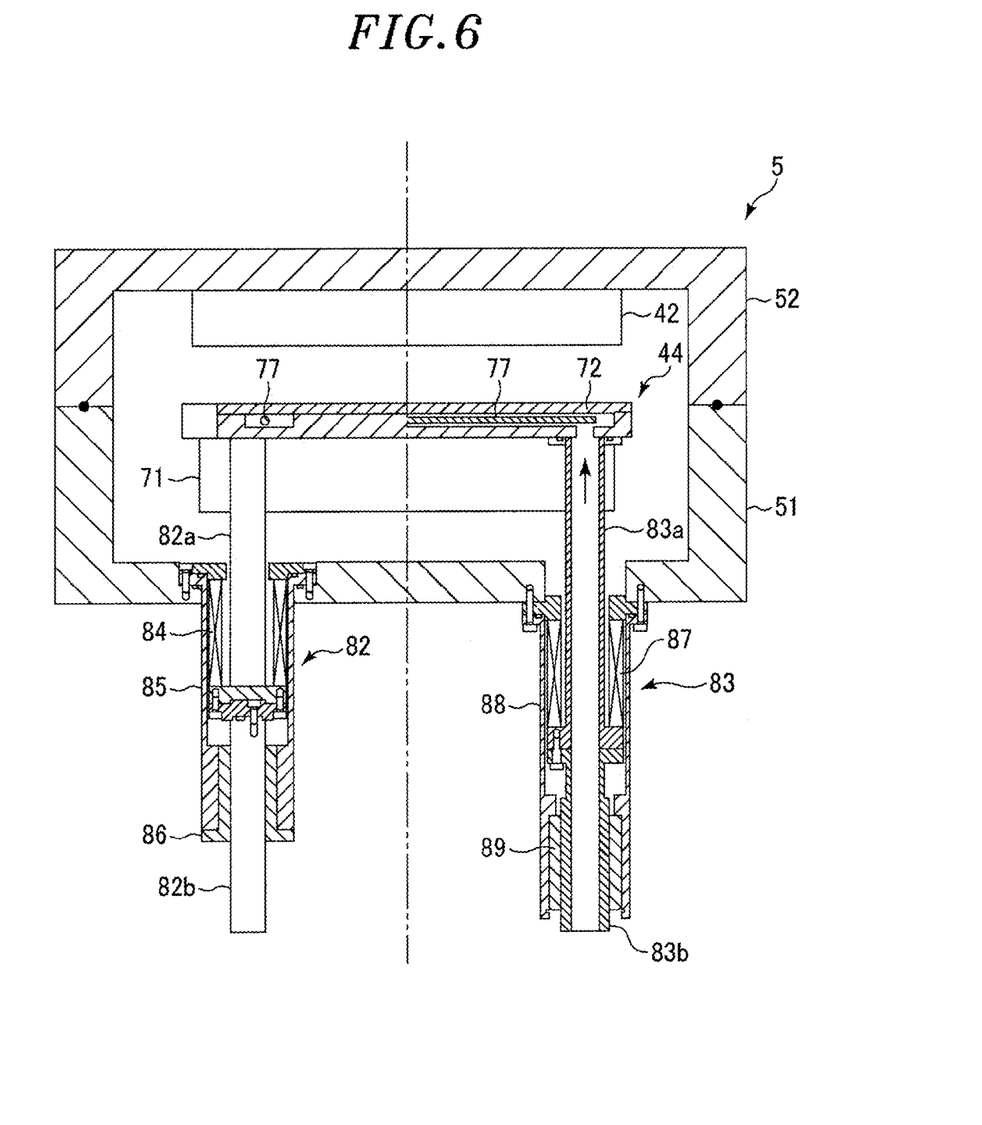
FIG. 6 is a cross-sectional view showing installation parts of a driving shaft and a guide shaft of the COR processing apparatus.

As shown in FIG. 6, the driving shaft 82 includes an upper shaft 82a and a lower shaft 82b. One end of an extendable bellows 84 is attached at the lower end of the upper shaft 82a. The lower shaft 82b is attached to the upper shaft 82a so as to lead from the outside of the chamber 40 to the upper shaft 82a. The lower shaft 82b is formed of a spline shaft of a ball spline. The bellows 84 is provided around the upper shaft 82a of the driving shaft 82, and the other end of the bellows 84 is attached at the bottom portion of the chamber 40. The bellows 84 contracts and extends when the driving shaft 82 is moved up and down, so that the inside of the chamber 40 is maintained in a vacuum state. At the bottom portion of the chamber 40, a case 85 accommodating the driving shaft 82 is attached to cover the outer side of the bellows 84. A sleeve 86 of the ball spline is provided at the inner side of the case 85 corresponding to the lower shaft 82b.

Further, as shown in FIG. 6, the guide shaft 83 includes an upper shaft 83a and a lower shaft 83b. One end of an extendable bellows 87 is attached at the lower end of the upper shaft 83a. The lower shaft 83b is attached to the upper shaft 83a so as to lead from the outside of the chamber 40 to the upper shaft 83a. The lower shaft 83b is guided by a guide bush 89. The bellows 87 is provided around the upper shaft 83a of the guide shaft 83, and the other end of the bellows 87 is attached at the bottom portion of the chamber 40. The bellows 87 contracts and extends when the guide shaft 83 is moved up and down, so that the inside of the chamber 40 is maintained in a vacuum state. At the bottom portion of the chamber 40, a case 88 accommodating the guide shaft 83 is attached to cover the outer side of the bellows 87. The guide bush 89 is provided at the inner side of the case 88 corresponding to the lower shaft 83b.

The lower end of the guide shaft 83 is arranged in an atmospheric space outside the chamber 40. Therefore, in a state where the inside of the chamber 40 is kept in a vacuum state, an upward force proportional to a cross-sectional area of the guide shaft 83 is applied to the guide shaft 83 by differential pressure. Although there exists a downward force such as a spring reaction force of the bellows 87 and a self-weight of the guide shaft 83, the upward force can be set larger than the downward force by properly setting an inner diameter of the guide shaft 83 and the like. Accordingly, the partition wall member 44 can be pushed up with an appropriate pressure. Consequently, the partition wall member 44 can be stably drived and uniformly elevated by the guide of the plurality of guide shafts 83, thereby ensuring a reliable sealing performance.

When the partition wall member 44 is lowered, the partition wall member 44 may be lowered through the driving shaft 82 by the actuator 81 against the upward force applied to the guide shaft 83 by the differential pressure. The actuator 81 may be used only in the descent of the partition wall member 44, so that the load of the actuator 81 and the driving shaft 82 is reduced. As shown in FIG. 3, when the partition wall member 44 is positioned below the mounting surface of the substrate mounting table 41 by lowering the partition wall member 44, it is possible to transfer the wafer W.

FIG. 6 shows a cross section of the COR processing apparatus 5, wherein the left side in FIG. 6 shows a cross section of an area where the driving shaft 82 is present, and the right side in FIG. 6 shows a cross section of an area where the guide shaft 83 is present. That is, the left and right sides with respect to a two-dot chain line show cross sections of different parts.

Figure 7:
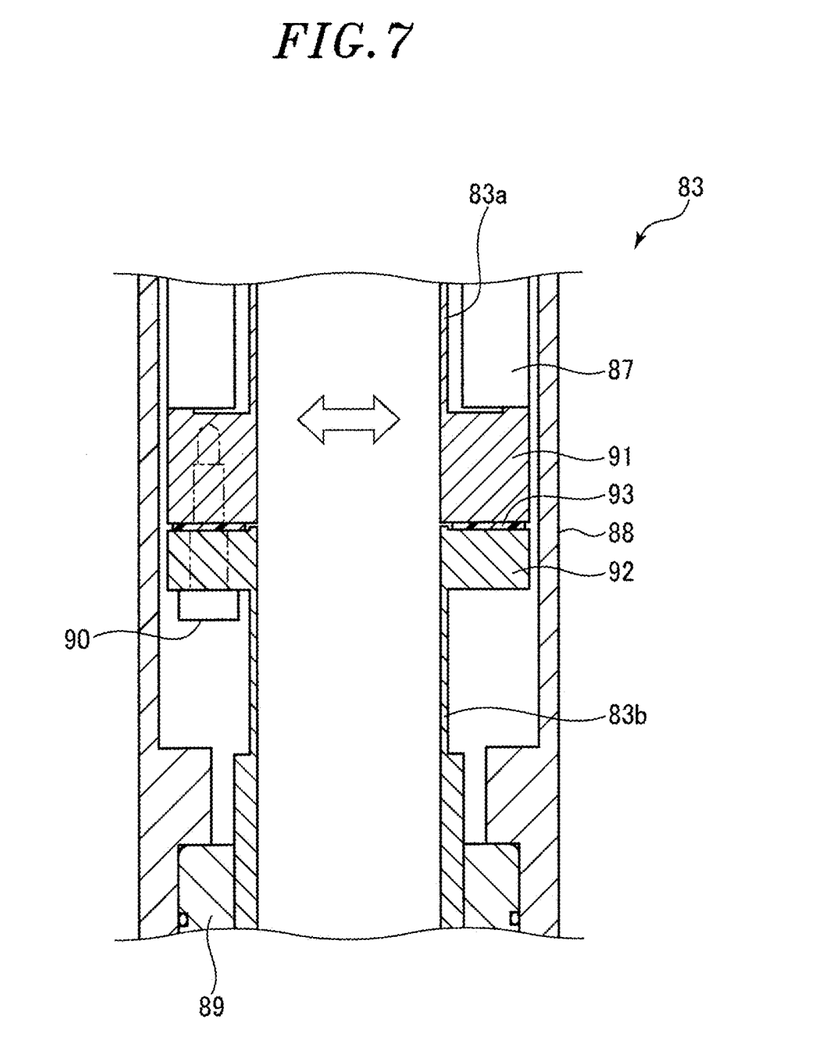
FIG. 7 is a cross-sectional view showing a joint portion between an upper shaft and a lower shaft of the guide shaft.

FIG. 7 is a cross-sectional view showing a joint portion of the upper shaft 83a and the lower shaft 83b of the guide shaft 83. The lower end of the upper shaft 83a has a flange 91 supporting the bellows 87 and the upper end of the lower shaft 83b has a flange 92 corresponding to the flange 91. A sliding member 93 made of a resin material having a good sliding property such as PTFE (polytetrafluoroethylene) and the like is provided at the upper surface of the flange 92 to generate a slide between the flange 91 and the sliding member 93. The flange 91 and the flange 92 are coupled by a screw 90 while allowing the slide between the flange 91 and the sliding member 93. A temperature of the upper shaft 83a of the guide shaft 83 may increase due to heat from the heater 77, so that the upper shaft 83a is thermally expanded in a relatively great extent. However, the lower shaft 83b is less affected by heat. For this reason, the guide shaft 83 may be distorted due to difference of the thermal expansion, thereby making the elevation and the descent difficult. In this regard, by providing the sliding member 93, the upper shaft 83a slides on the sliding member 93 so that the difference of the thermal expansion can be absorbed.

The exhaust mechanism 47 includes: an exhaust line 101 connected to an exhaust port (not shown) formed at the bottom portion 51b of the chamber 40; an automatic pressure control (APC) valve 102, provided at the exhaust line 101, for controlling a pressure in the chamber 40; and a vacuum pump 103 for exhausting the inside of the chamber 40.

In order to measure a pressure in each of the two processing spaces S, a high pressure capacitance manometer 105a and a low pressure capacitance manometer 105b are respectively provided to be inserted into the exhaust space 68 corresponding to each of the processing spaces S from the bottom of the chamber 40. An opening degree of the APC valve 102 is controlled based on a pressure measured by the capacitance manometer 105a or 105b.

(Process Operation by the COR Processing Apparatus)

Next, a process operation by the COR processing apparatus configured as above will be described.

Initially, in a state shown in FIG. 3 where the partition wall member 44 is lowered through the driving shaft 82 by the actuator 81, the gate valve 54 is opened and two wafers W are loaded into the chamber 40 through a loading/unloading port (not shown). The wafers W are mounted on the respective substrate mounting tables 41.

Next, an operation of the actuator 81 is stopped, and the guide shaft 83 is elevated by an upward force due to the differential pressure between the inside of the chamber 40 which is a vacuum state and the outside of the chamber 40, which is an atmospheric space. Then, the partition wall member 44 is pushed up to become a state shown in FIG. 2. That is, the partition wall member 44 and the gas introduction member 42 stick together by making the sealing member 74 come into contact with the bottom surface of the gas introduction member 42, and the partition wall member 44 and the inner wall 43 stick together by making the sealing member 75 come into contact with the top surface of the inner flange part 73 of the partition wall member 44. By this, a substantially airtight processing space S is formed.

Next, HF gas, $NH_3$ gas, and an inert gas such as $N_2$ gas, Ar gas or the like are injected in a shower form into the chamber 40 from the gas supply mechanism 46 through the gas injection holes 66 of the gas introduction member 42. Then, the COR processing is performed with respect to a $SiO_2$ film formed on the surface of the wafer W. During the COR processing, HF gas and $NH_3$ gas react with the $SiO_2$ film on the surface of the wafer W to generate ammonium fluorosilicate (AFS) which can be decomposed and removed by heat.

After completing the COR processing, the partition wall member 44 is lowered by the actuator 81 of the elevating mechanism 45 to become a state shown in FIG. 3. The gate valve 54 is opened and two processed wafers W are unloaded through a loading/unloading port (not shown).

In the above process operation, since the partition wall member 44 is driven up and down, deposits adhered to the partition wall member 44 may be dropped out by the driving, thereby generating particles. Moreover, when the partition wall member 44 is lifted and comes into contact with the gas introduction member 42, particles may be generated from the contact portion. If the particles are adhered to the wafer W, the wafer W becomes to have a defect.

Therefore, in order to suppress the adherence of the particles onto the wafer W, when the partition wall member is moved up and down, a gas is introduced from the gas introduction member 42 to form a gas flow guiding the particles to the exhaust side. Here, the gas may be a gas that does not contribute to the processing of the wafer W without an adverse effect. It is preferable that the gas is an inert gas. In the present example, either one or both of $N_2$ gas and Ar gas can be used. A flow rate and a pressure of the gas are controlled so as to form a flow that does not allow the particles to adhere to the wafer W. If a gas flow rate is too low, an effective flow is not formed, and if a gas flow rate is too high, the particles are excited and rather easily adhere to the wafer W. If a pressure is too low, the gas becomes molecular so that forming a gas flow toward an exhaust side is difficult. In this respect, it is preferable that the gas flow rate is 500 to 1000 sccm (mL/min) and the pressure in the chamber is 1000 mTorr (133.3 Pa) or above. In an aspect of forming an appropriate gas flow, an upper limit of the pressure does not exist. However, considering the process condition, it is preferable that the pressure is 3000 mTorr (400 Pa) or less.

Figure 8:
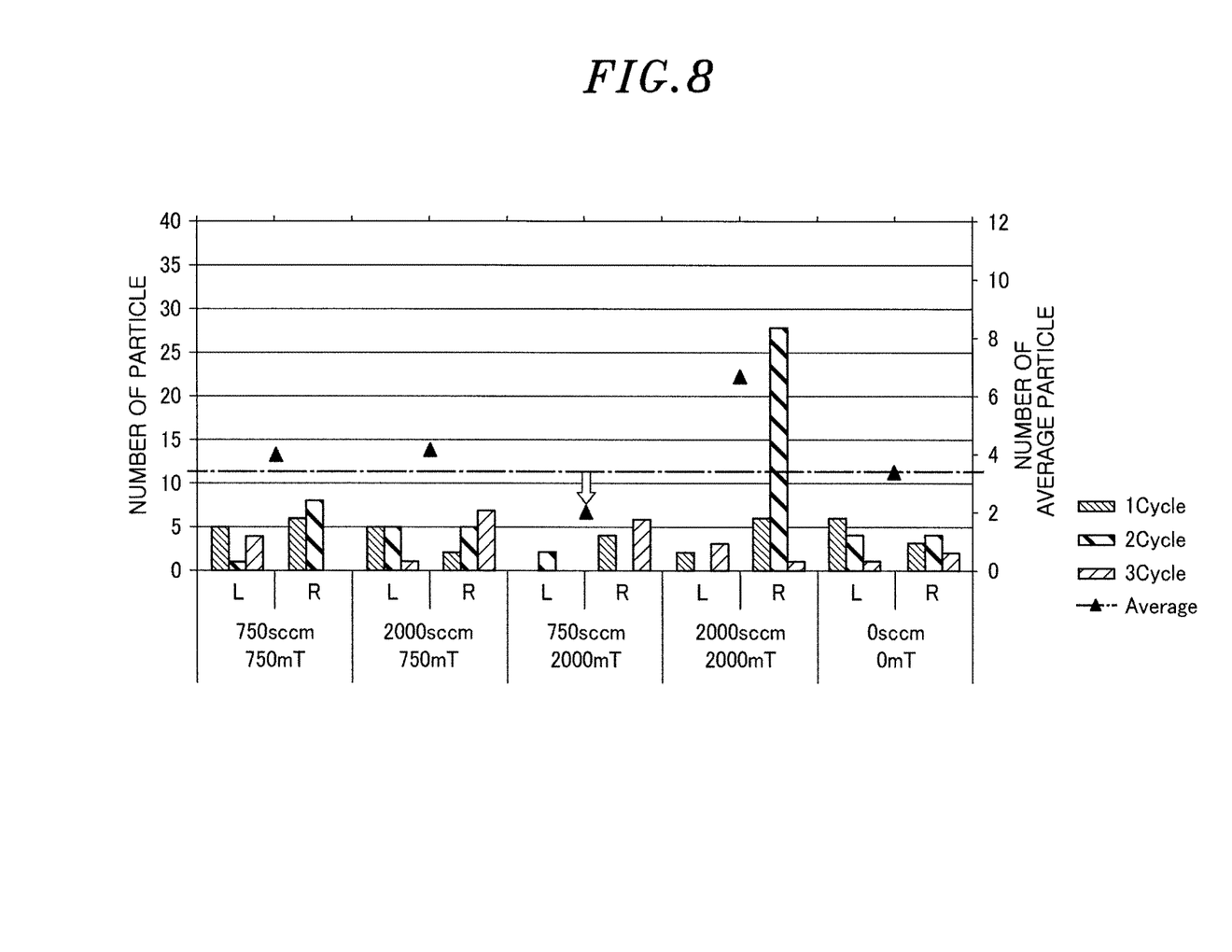
FIG. 8 is a view showing an evaluation result of the number of particles adhered to the wafer when forming a gas flow while varying a condition when the partition wall member is drived.

Practically, the number of particles adhered to the wafer was evaluated when a gas flow was formed while varying a condition when moving up and down the partition wall member 44. The results are shown in FIG. 8. Here, $N_2$ gas was used, and a case of supplying no gas when the partition wall member 44 is drived was used as a criterion. In this case, the number of particles was counted 3 times while changing a gas flow rate to two levels of 750 sccm and 2000 sccm and a pressure to two levels of 750 mTorr and 2000 mTorr. As a result, at the gas flow rate of 750 sccm and the pressure of 2000 mTorr, the particles were reduced to about a half, compared to the case of supplying no gas.

As such, in a case where the partition wall member 44 is elevated while forming a gas flow, after the partition wall member 44 contacts with the gas introduction member 42 to form the processing space S, a pressure in the processing space S is controlled and the COR processing is performed. Further, in a case where the partition wall member 44 is lowered while forming a gas flow, after completing the descent of the partition wall member 44, the gas supply is stopped and the wafer W is unloaded.

Effect of the Embodiment

In accordance with the present embodiment, the processing space S for a single wafer W is formed by elevating the partition wall member 44. Accordingly, the COR processing can be uniformly performed under a condition that there is no interference from another wafer and the like. With respect to each processing space S, a processing gas is supplied in a shower form from the gas introduction member 42 toward the wafer W. Accordingly, the gas can be uniformly distributed and thus the process can also be performed with a more uniform distribution. Further, the post-process gas is discharged through the slits of the inner wall 43 from the annular exhaust space 68 between the substrate mounting table 41 and the inner wall 43. Accordingly, a uniform exhaust can be performed and the gas in the processing space S can be more uniformly distributed. Furthermore, the process is performed in a narrow space surrounded by the partition wall member 44. Accordingly, a gas usage amount is reduced so that energy-saving effect can be obtained, and a throughput can be improved by the reduction of the pressure control time.

The flange part 72 at the upper portion of the partition wall member 44 is heated to, e.g., 30° C. to 150° C. by the heater 77 provided in the flange part 72 of the partition wall member 44. The heat rapidly diffuses from the upper portion of the partition wall member 44 made of aluminum or aluminum alloy having a high thermal conductivity to the lower portion thereof. Accordingly, a temperature in the processing space S can be controlled in a uniformly heated state, and thus uniformity of the process can be more enhanced. The groove portion 76 accommodating the heater 77 communicates with an atmosphere through the guide shaft 83 of the elevating mechanism 45. The groove portion 76 is an atmospheric space. Therefore, an excessive temperature increase and the like hardly occur and controllability of the heater 77 becomes satisfactory.

Figure 9A:
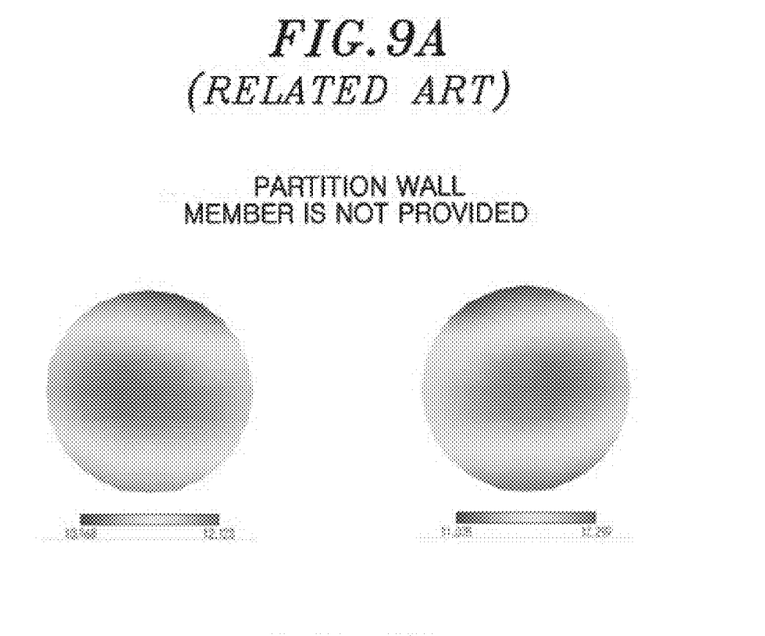
FIGS. 9A and 9B show comparative results of a process distribution in a case where a COR processing is performed by using a conventional apparatus having no partition wall member and in a case where a COR processing is performed in a state of FIG. 2 having the partition wall member.
Figure 9B:
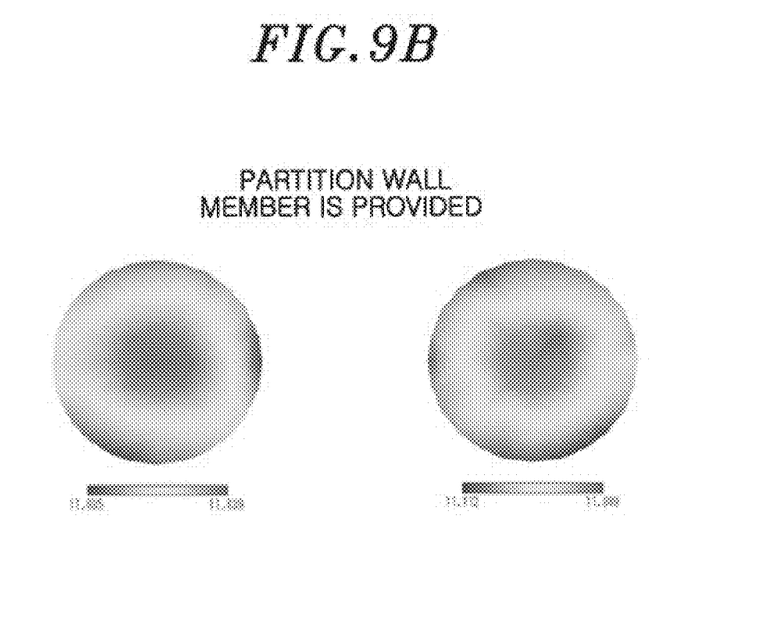

Practically, a process distribution was compared between a case where the COR processing was performed by using a conventional device having no partition wall member and a case where the COR processing was performed in a state of FIG. 2 having the partition wall member 44. The result is shown in FIGS. 9A and 9B. In the case of using the conventional device, as shown in FIG. 9A, both wafers were subjected to non-uniform process due to the interference from each other. However, in the case of the present embodiment provided with the partition wall member 44, as shown in FIG. 9B, it was found that the process distribution was formed in a concentric circular shape and the uniformity of the process was improved.

As described above, a temperature of the upper shaft 83a of the guide shaft 83 may be increased by heating the partition wall member 44 by the heater 77. Accordingly, the upper shaft 83a is thermally expanded in a relatively great extent, while the lower shaft 83b is less affected by the heating. Therefore, the guide shaft 83 may be distorted by the difference of thermal expansion, thereby making it difficult to move the guide shaft 83 up and down. In this regard, in the present embodiment, the sliding member 93 made of a resin material having a good sliding property such as PTFE is provided between the flange 91 at the lower end of the upper shaft 83a of the guide shaft 83 and the flange at the upper end of the lower shaft 83b to generate a sliding between the flange 91 and the sliding member 93. The flange 91 and the flange 92 are coupled by a screw 90 in a state where a sliding is allowed between the flange 91 and the sliding member 93. Consequently, the upper shaft 83a slides on the sliding member 93 so that the difference of thermal expansion can be absorbed.

There is provided a plurality of the guide shafts 83 to which an upward force is applied by the differential pressure between the inside of the chamber 40 that is a vacuum state and the outside of the chamber 40 that is an atmospheric space. The partition wall member 44 is elevated through the guide shafts 83. Therefore, a stable driving can be performed by the plurality of guide shafts 83, the partition wall member 44 can be uniformly lifted, a plane stabilization of the seal surface can be realized, and a reliable sealing performance can be ensured. Further, since the actuator 81 may be used only when the partition wall member 44 is lowered, the load of the actuator 81 and the driving shaft 82 can be reduced.

When forming the processing space S by elevating the partition wall member 44, the processing space S is sealed, at upper and lower positions, by the sealing member 74 between the partition wall member 44 and the gas introduction member 42, and the sealing member 75 between the partition wall member 44 and the inner wall 43. Accordingly, the processing space having a good airtightness can be formed.

Further, it is possible to form two processing spaces simultaneously by using the single partition wall member 44, so that a configuration of the elevating mechanism is not complicated.

When the partition wall member 44 is being drived, a gas flow that guides the particles to the exhaust side is formed. Accordingly, the particles generated at the time of driving of the partition wall member 44 are effectively suppressed from adhering to the wafer W.

(Other Applications)

The present invention may be variously modified without being limited to the above embodiment. For example, the present invention is applied to the COR processing apparatus in the above embodiment, but not limited thereto. In a case of gas processing, the present invention may be applied to another process, e.g., a film forming process by a chemical vapor deposition (CVD). Further, the present invention may be applied to a process using a plasma.

In the above embodiment, there has been shown a case in which a gas is injected in a shower form from the gas introduction member provided opposite to the substrate mounting table. However, the present invention is not limited thereto. The gas may be injected from a nozzle in another form.

In the above embodiment, there has been shown a case in which a gas is discharged through the slits of the inner wall from the exhaust space between the substrate mounting table and the inner wall. However, the present invention is not limited thereto. The gas may be discharged from another part at a gas introduction member side or the like.

In the above embodiment, there has been shown an example in which two objects are processed at a time. However, the present invention is not limited thereto. The present invention may be a single wafer processing type in which one wafer is processed at a time, or the present invention may process 3 or more wafers at a time.

Figure 10:
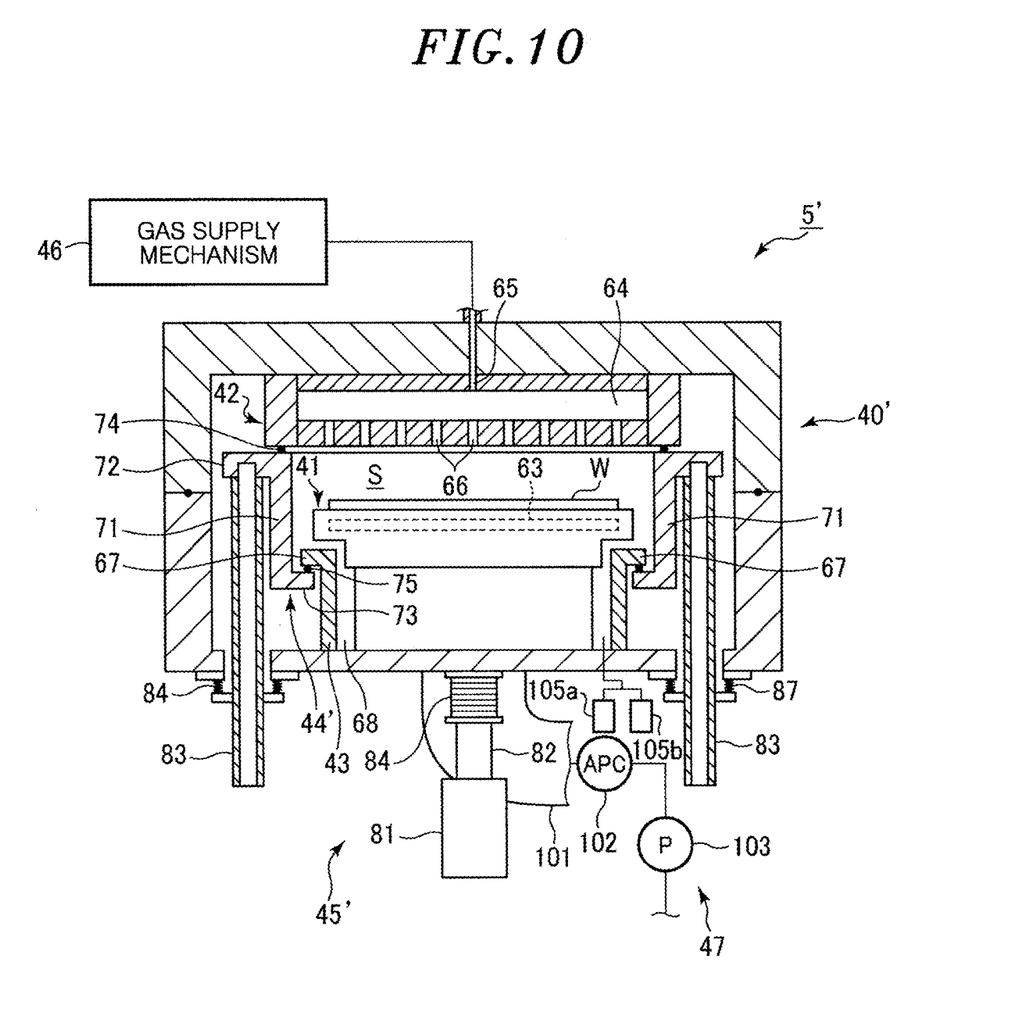
FIG. 10 is a cross-sectional view showing a COR processing apparatus in accordance with another embodiment of the present invention.

An example of a COR processing apparatus of a single wafer processing type is shown in FIG. 10. The COR processing apparatus 5' includes a chamber 40'. In the inside of the chamber 40', one substrate mounting table 41, one gas introduction member 42 and one inner wall 43 having the same configuration as those of the COR processing apparatus 5 shown in FIGS. 2 and 3 are arranged. A partition wall member 44' for forming a single processing space S of a substantially airtight state between the substrate mounting table 41 and the gas introduction member 42 is provided so as to be moved up and down by an elevating mechanism 45' having an almost same configuration as that of the COR processing apparatus 5 shown in FIGS. 2 and 3. The COR processing apparatus 5' further includes the gas supply mechanism 46 and the exhaust mechanism 47 which are the same as those of the COR processing apparatus 5.

Still in the single wafer processing apparatus, if the partition wall member is not provided, a gas flow and a temperature uniformity may not be maintained and thus a uniform processing may not be ensured. However, by providing the partition wall member 44', uniformity of the processing can be improved. Further, since the processing is performed in a narrow space surrounded by the partition wall member 44', a gas usage amount is reduced so that energy-saving effect can be obtained, and a throughput can be improved by the reduction of the pressure control time.

In the above embodiment, a semiconductor wafer has been exemplified as an object to be processed. However, based on the principle of the present invention, it is obvious that the object to be processed is not limited to the semiconductor wafer. It is needless to say that the present invention may be applied to a process of other various substrates.

While the invention has been shown and described with respect to the embodiments, it will be understood by those skilled in the art that various changes and modifications may be made without departing from the scope of the invention as defined in the following claims.

What is claimed is:

1. A substrate processing apparatus configured to process a plurality of substrates under a vacuum atmosphere, the substrate processing apparatus comprising:
   a chamber including a sidewall and configured to accommodate the substrates and to be kept in the vacuum atmosphere;
   a plurality of substrate mounting tables configured to respectively mount the substrates thereon in the chamber;
   at least one gas introduction member configured to introduce a gas including a processing gas in the chamber;
   a partition wall member surrounded by the sidewall and including a plurality of cylindrical parts, the partition wall member being configured to be movable up and down between an upper position and a lower position in the chamber; and
   an elevating mechanism configured to move the partition wall member up and down,
   wherein when the partition wall member is in the lower position, spaces inside the cylindrical parts and a space between the sidewall of the chamber and the partition wall member communicate with each other, and
   wherein when the partition wall member is in the upper position, the cylindrical parts surround the substrate mounting tables in a one-to-one corresponding manner, each of the cylindrical parts defines a processing space therein, and the processing spaces in the cylindrical parts and the space between the sidewall of the chamber and the partition wall member are air-tightly partitioned from each other.

2. The substrate processing apparatus of claim 1, wherein the cylindrical parts are formed integrally.

3. The substrate processing apparatus of claim 1, wherein the at least one gas introduction member includes a plurality of gas introduction members provided to correspond to the processing spaces and the processing gas is introduced from each of the gas introduction members into the corresponding processing space.

4. The substrate processing apparatus of claim 1, wherein the partition wall member further includes a flange part provided in a flange shape at top portions of the cylindrical parts.

5. The substrate processing apparatus of claim 4, wherein the partition wall member further includes a heater provided in the flange part, and increases heat uniformity of the processing spaces by heat of the heater.

6. The substrate processing apparatus of claim 5, wherein the heater is provided in a space maintained in an atmospheric pressure in the flange part.

7. The substrate processing apparatus of claim 1, wherein the at least one gas introduction member is provided to face the substrate mounting tables, and the substrate processing apparatus further comprises a first sealing member for sealing a gap between the partition wall member and the at least one gas introduction member when the processing spaces are formed.

8. The substrate processing apparatus of claim 7, wherein the first sealing member is a lip seal having a main part and a lip part protruding obliquely from the main part and constituting a sealing portion, and the gap is sealed so that a clearance between the partition wall member and the gas introduction member is in a range from 1.6 to 3.6 mm.

9. The substrate processing apparatus of claim 7, further comprising:
   an inner wall provided around the substrate mounting tables with a space therebetween, the inner wall having slits; and a second sealing member for sealing a gap between the partition wall member and the inner wall when the processing spaces are formed, wherein a gas exhaust from the processing spaces is performed through the slits from the space between the substrate mounting table and the inner wall.

10. The substrate processing apparatus of claim 9, wherein the second sealing member is a lip seal having a main part and a lip part protruding obliquely from the main part and constituting a sealing portion, and the gap is sealed so that a clearance between the partition wall member and the inner wall is in a range from 1.6 to 3.6 mm.

11. The substrate processing apparatus of claim 8, wherein a differential pressure between an inner side and an outer side of the partition wall member is 300 Torr or less.

12. The substrate processing apparatus of claim 1, wherein the elevating mechanism includes: an actuator capable of moving the partition wall member up and down; a driving shaft extended from the actuator, a leading end of the driving shaft being attached to the partition wall member; and a plurality of guide shafts extended to an outside of the chamber, leading ends of the guide shafts being attached to the partition wall member, wherein the guide shafts are elevated by an upward force due to a differential pressure between an inside of the chamber which is kept in a vacuum state and an outside of the chamber which is an atmospheric space to elevate the partition wall member.

13. The substrate processing apparatus of claim 12, wherein each of the guide shafts includes an upper shaft connected to the partition wall member and a lower shaft connected to the upper shaft, wherein the upper shaft and the lower shaft are coupled through a sliding member while allowing a slide therebetween so that each of the guide shafts is configured to be able to absorb a difference of thermal expansion.

14. The substrate processing apparatus of claim 1, wherein the gas introduction member is provided to face the substrate mounting table and has a plurality of gas injection holes at a bottom thereof, wherein the gas introduction member injects the processing gas in a shower form into the processing spaces.

15. The substrate processing apparatus of claim 1, further comprising:

a control unit configured to control a gas introduction from the gas introduction member when the partition wall member moves up and down, in order to suppress adherence of particles onto the substrate by forming a gas flow guiding the particles in the chamber to a gas exhaust side.

16. The substrate processing apparatus of claim 15, wherein the control unit controls the gas introduction from the gas introduction member such that a gas flow rate becomes 500 sccm to 1000 sccm and a pressure in the chamber becomes 1000 mTorr or above.

17. A substrate processing method for performing a predetermined process on a substrate by way of mounting the substrate on a substrate mounting table in a chamber including a sidewall and kept in a vacuum state, providing a partition wall member which is surrounded by the sidewall and includes a cylindrical part, the partition wall member being configured to be movable up and down between an upper position and a lower position in the chamber, and introducing a processing gas from a gas introduction member into a processing space, the substrate processing method comprising:

moving down the partition wall member to the lower position to allow the substrate to be transferred onto the substrate mounting table;

loading the substrate into the chamber and mounting the substrate on the substrate mounting table;

moving up the partition wall member to the upper position to form the processing space in the chamber;

introducing the processing gas into the processing space to perform the predetermined process on the substrate;

moving down the partition wall member to the lower position to allow the substrate to be unloaded from the chamber; and unloading the substrate from the chamber in a state where the partition wall member is moved down, wherein when the partition wall member is in the lower position, a space inside the cylindrical part and a space between the sidewall of the chamber and the partition wall member communicate with each other, and wherein when the partition wall member is in the upper position, the cylindrical part surrounds the substrate mounting table and defines the processing space therein, and the processing space in the cylindrical part and the space between the sidewall of the chamber and the partition wall member are air-tightly partitioned from each other.

18. The substrate processing method of claim 17, wherein an inert gas is introduced into the chamber from the gas introduction member at the time of moving up and down the partition wall member, in order to suppress adherence of particles onto the substrate by forming a gas flow guiding the particles in the chamber to an exhaust side.

19. The substrate processing method of claim 18, wherein the gas is introduced at the time of moving up and down the partition wall member such that a gas flow rate becomes 500 sccm to 1000 sccm and a pressure in the chamber becomes 1000 mTorr or above.

20. A substrate processing apparatus which performs a predetermined process on a substrate by using a processing gas under a vacuum atmosphere, the substrate processing apparatus comprising:

a chamber including a sidewall and configured to accommodate the substrate and to be kept in the vacuum atmosphere;

a substrate mounting table configured to mount the substrate thereon in the chamber;

a gas introduction member configured to introduce a gas including the processing gas in the chamber;

a partition wall member surrounded by the sidewall and including a cylindrical part, the partition wall member being configured to be movable up and down between an upper position and a lower position in the chamber; and an elevating mechanism configured to move the partition wall member up and down, wherein when the partition wall member is in the lower position, a space inside the cylindrical part and a space between the sidewall of the chamber and the partition wall member communicate with each other, and wherein when the partition wall member is in the upper position, the cylindrical part surrounds the substrate mounting table and defines a processing space therein, and the processing space in the cylindrical part and the space between the sidewall of the chamber and the partition wall member are air-tightly partitioned from each other.

* * * * *